United States Patent
Kim et al.

(10) Patent No.: US 7,580,491 B2
(45) Date of Patent: Aug. 25, 2009

(54) QUARTER-RATE CLOCK RECOVERY CIRCUIT AND CLOCK RECOVERING METHOD USING THE SAME

(75) Inventors: Nyun-Tae Kim, Yongin-si (KR); Ki-Mio Ueda, Seoul (KR); Hwa-Su Koh, Seongnam-si (KR); Dae-Seung Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 562 days.

(21) Appl. No.: 11/193,329

(22) Filed: Aug. 1, 2005

(65) Prior Publication Data

US 2006/0029160 A1    Feb. 9, 2006

(30) Foreign Application Priority Data

Aug. 4, 2004    (KR) .................. 10-2004-0061262

(51) Int. Cl.
*H04L 7/00*    (2006.01)
(52) U.S. Cl. .................. 375/354; 375/375; 375/376; 375/371; 375/373; 341/143; 455/403
(58) Field of Classification Search .............. 375/354, 375/375, 376, 371, 373; 341/143; 455/403
See application file for complete search history.

(56) References Cited

U.S. PATENT DOCUMENTS 6,122,336  A     9/2000  Anderson
6,597,212  B1    7/2003  Wang et al.
2004/0022339  A1*  2/2004  Nakao .................. 375/376
2004/0203559  A1* 10/2004  Stojanovic et al. ......... 455/403
2005/0180536  A1*  8/2005  Payne et al. .............. 375/354
2005/0265504  A1* 12/2005  Robinson et al. .......... 375/375

FOREIGN PATENT DOCUMENTS

JP    2003-224532    8/2003
KR    2002-0050730   6/2002

* cited by examiner

*Primary Examiner*—David C Payne
*Assistant Examiner*—Zewdu Kassa
(74) *Attorney, Agent, or Firm*—Harness Dickey & Pierce P.L.C.

(57) ABSTRACT

A quarter-rate clock recovery circuit includes a clock generator, a phase interpolation unit, a phase detector, and a controller. The clock generator generates first through fourth clocks having a quarter frequency of a data-rate of input data, the second, third and fourth clocks have phase differences of 90, 180, and 270 degrees with respect to a phase of the first clock, respectively. The phase interpolation unit performs a phase interpolation on the first through fourth clocks based on control signals to generate fifth through eighth clocks that have a quarter frequency of the data-rate of the input data, the fifth clock tracking a phase of the input data, the sixth, seventh, and eighth clocks respectively have phase differences of 45, 90, and 135 degree with respect to a phase of the fifth clock. The phase detector outputs signals corresponding to phase differences between the input data and the fifth through eighth clocks based on the input data and the fifth through eighth clocks. The controller generates the control signals to control the phase interpolation unit based on the signals output from the phase detector.

19 Claims, 9 Drawing Sheets

| UP | DOWN | DSEL | REG[31:0] | DAC1[31:0] | DAC2[31:0] | DAC3[31:0] | DAC4[31:0] |
|---|---|---|---|---|---|---|---|
| 1 | 0 | 00 | 00000000h | FFFFFFFFh | 00000000h | 00000000h | 00000000h |
| 1 | 0 | 00 | 80000000h | 7FFFFFFFh | 00000001h | 00000000h | 00000000h |
| 1 | 0 | 00 | C0000000h | 3FFFFFFFh | 00000003h | 00000000h | 00000000h |
| 1 | 0 | 00 | E0000000h | 1FFFFFFFh | 00000007h | 00000000h | 00000000h |
| 1 | 0 | 00 | F0000000h | 0FFFFFFFh | 0000000Fh | 00000000h | 00000000h |
| . . . . . . . . . . . | | | | | | | |
| 1 | 0 | 00 | FFFFFFF8h | 00000007h | 1FFFFFFFh | 00000000h | 00000000h |
| 1 | 0 | 00 | FFFFFFFCh | 00000003h | 3FFFFFFFh | 00000000h | 00000000h |
| 1 | 0 | 00 | FFFFFFFEh | 00000001h | 7FFFFFFFh | 00000000h | 00000000h |
| 1 | 0 | 00 | FFFFFFFFh | 00000000h | FFFFFFFFh | 00000000h | 00000000h |
| 1 | 0 | 01 | FFFFFFFEh | 00000000h | 7FFFFFFFh | 00000001h | 00000000h |
| 1 | 0 | 01 | FFFFFFFCh | 00000000h | 3FFFFFFFh | 00000003h | 00000000h |
| . . . . . . . . . . . | | | | | | | |
| 1 | 0 | 01 | 00000000h | 00000000h | 00000000h | FFFFFFFFh | 00000000h |
| 1 | 0 | 11 | 80000000h | 00000000h | 00000000h | 7FFFFFFFh | 00000001h |
| 1 | 0 | 11 | C0000000h | 00000000h | 00000000h | 3FFFFFFFh | 00000003h |
| 1 | 0 | 11 | E0000000h | 00000000h | 00000000h | 1FFFFFFFh | 00000007h |
| . . . . . . . . . . . | | | | | | | |
| 1 | 0 | 11 | FFFFFFFFh | 00000000h | 00000000h | 00000000h | FFFFFFFFh |
| 1 | 0 | 10 | FFFFFFFEh | 00000001h | 00000000h | 00000000h | 7FFFFFFFh |
| 1 | 0 | 10 | FFFFFFFCh | 00000003h | 00000000h | 00000000h | 3FFFFFFFh |
| 1 | 0 | 10 | FFFFFFF8h | 00000007h | 00000000h | 00000000h | 1FFFFFFFh |
| 1 | 0 | 10 | FFFFFFF0h | 0000000Fh | 00000000h | 00000000h | 0FFFFFFFh |
| . . . . . . . . . . . | | | | | | | |
| 1 | 0 | 10 | 80000000h | 7FFFFFFFh | 00000000h | 00000000h | 00000001h |
| 1 | 0 | 10 | 00000000h | FFFFFFFFh | 00000000h | 00000000h | 00000000h |

FIG. 5B

| UP | DOWN | DSEL | REG[31:0] | DAC5[31:0] | DAC6[31:0] | DAC7[31:0] | DAC8[31:0] |
|---|---|---|---|---|---|---|---|
| 1 | 0 | 00 | 00000000h | 0000FFFFh | 0000FFFFh | 00000000h | 00000000h |
| 1 | 0 | 00 | 80000000h | 00007FFFh | 0001FFFFh | 00000000h | 00000000h |
| 1 | 0 | 00 | C0000000h | 00003FFFh | 0003FFFFh | 00000000h | 00000000h |
| 1 | 0 | 00 | E0000000h | 00001FFFh | 0007FFFFh | 00000000h | 00000000h |
| 1 | 0 | 00 | F0000000h | 00000FFFh | 000FFFFFh | 00000000h | 00000000h |
| . . . . . . . . . . | | | | | | | |
| 1 | 0 | 00 | FFFFFFF8h | 00000000h | 0007FFFFh | 00001FFFh | 00000000h |
| 1 | 0 | 00 | FFFFFFFCh | 00000000h | 0003FFFFh | 00003FFFh | 00000000h |
| 1 | 0 | 00 | FFFFFFFEh | 00000000h | 0001FFFFh | 00007FFFh | 00000000h |
| 1 | 0 | 00 | FFFFFFFFh | 00000000h | 0000FFFFh | 0000FFFFh | 00000000h |
| 1 | 0 | 01 | FFFFFFFEh | 00000000h | 00007FFFh | 0001FFFFh | 00000000h |
| 1 | 0 | 01 | FFFFFFFCh | 00000000h | 00003FFFh | 0003FFFFh | 00000000h |
| . . . . . . . . . . | | | | | | | |
| 1 | 0 | 01 | 00000000h | 00000000h | 00000000h | 0000FFFFh | 0000FFFFh |
| 1 | 0 | 11 | 80000000h | 00000000h | 00000000h | 00007FFFh | 0001FFFFh |
| 1 | 0 | 11 | C0000000h | 00000000h | 00000000h | 00003FFFh | 0003FFFFh |
| 1 | 0 | 11 | E0000000h | 00000000h | 00000000h | 00001FFFh | 0007FFFFh |
| . . . . . . . . . . | | | | | | | |
| 1 | 0 | 11 | FFFFFFFFh | 0000FFFFh | 00000000h | 00000000h | 0000FFFFh |
| 1 | 0 | 10 | FFFFFFFEh | 0001FFFFh | 00000000h | 00000000h | 00007FFFh |
| 1 | 0 | 10 | FFFFFFFCh | 0003FFFFh | 00000000h | 00000000h | 00003FFFh |
| 1 | 0 | 10 | FFFFFFF8h | 0007FFFFh | 00000000h | 00000000h | 00001FFFh |
| 1 | 0 | 10 | FFFFFFF0h | 000FFFFFh | 00000000h | 00000000h | 00000FFFh |
| . . . . . . . . . . | | | | | | | |
| 1 | 0 | 10 | 80000000h | 0001FFFFh | 00007FFFh | 00000000h | 00000000h |
| 1 | 0 | 10 | 00000000h | 0000FFFFh | 0000FFFFh | 00000000h | 00000000h |

QUARTER-RATE CLOCK RECOVERY CIRCUIT AND CLOCK RECOVERING METHOD USING THE SAME

CLAIM OF PRIORITY

A claim of priority under 35 U.S.C. §119 is made to Korean Patent Application No. 2004-61262 filed on Aug. 4, 2004 in the Korean Intellectual Property Office (KIPO), the entire contents of which are hereby incorporated by reference.

BACKGROUND OF THE INVENTION

1. Field of the Invention

Example embodiments of the present invention generally relate to a clock recovery circuit. In particular example embodiments of the present invention relate to a quarter-rate clock recovery circuit, and a method of recovering clock data using the same.

2. Description of the Related Art

In general, parallel circuits are more difficult to design than serial circuits. Therefore, in order to save costs in wiring and interconnection and/or to avoid noise, for example, a cross-talk noise associated with parallel circuits, a recent trend has been to transmit digital data between remote devices in a serial manner rather than in a parallel manner.

In a serial data transmission, data are serially transmitted through, for example, a single optical fiber, coaxial, or twisted-pair cable at a high speed. In a parallel data transmission, multiple lines are used to transmit several data streams simultaneously.

In order to reduce costs, a receiver may recover a clock from a bit stream of received high speed digital data using clock recovery circuit (CRC) instead of separately transmitting a clock synchronized with serial high speed digital data to a remote receiver. A conventional clock recovery circuit (CRC) may use a phase locked loop (PLL) or delay locked loop (DLL).

Figure 1:
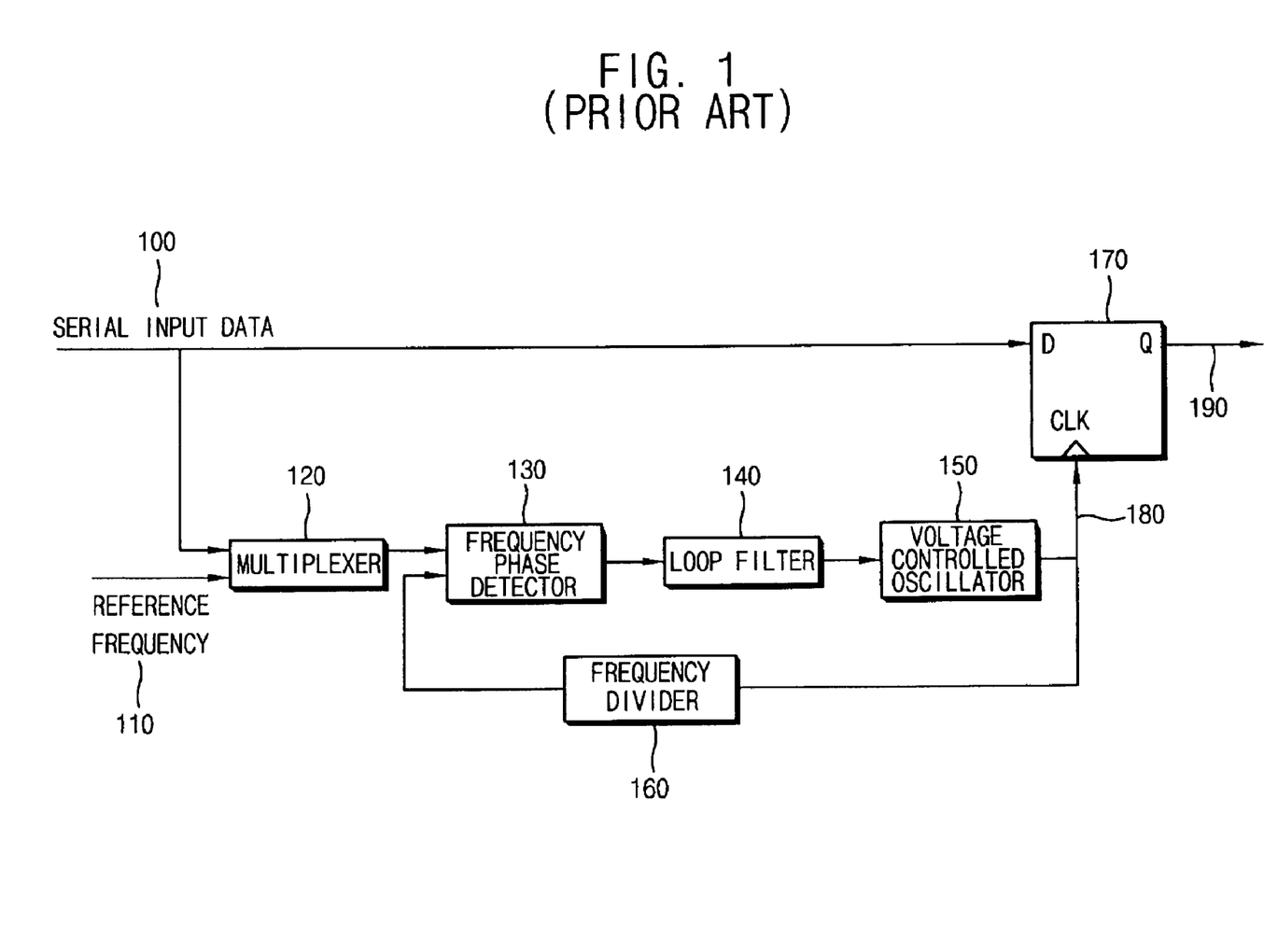
FIG. 1 is a block diagram illustrating a prior art or prior art publication date of Dec. 14, 1999 clock recovery circuit using a phase locked loop (PLL)

FIG. 1 is a block diagram illustrating a conventional clock recovery circuit using a phase locked loop (PLL).

A multiplexer 120 may receive a reference frequency clock 110 as an input. The reference frequency clock 110 may be generated by a crystal oscillator. The crystal oscillator may generate a relatively low frequency clock to provide to the multiplexer 120.

The reference frequency clock 110 may pass through a feedback loop to generate a high-frequency clock. The feedback loop may include a frequency phase detector 130, a loop filter 140, a voltage-controlled oscillator (VCO) 150, and/or a frequency divider 160.

When the oscillated high-frequency clock reaches a desired frequency, serial input data 100, and not the reference frequency clock 110, may be input to the phase locked loop (PLL) through the multiplexer 120.

A clock 180 synchronized to the serial input data 100 may be output from the VCO 150. The clock 180 may be applied to a flip-flop 170 with the serial input data 100, and a clock data 190 may be output from the flip flop 170.

In general, if a high-rate serial input data phase is input to a phase locked loop (PLL), and the high-rate serial input data has jitter, the PLL must be adapted to provide a clock synchronized to the high-rate serial input data in a short time.

Performance of the clock recovery circuit depends on the performance of the phase locked loop (PLL). However, it may be difficult to design a PLL capable of higher performance, because that may require a larger amount of power dissipation and/or a large chip area, which may increase noise.

A solution to the above problems may be phase interpolation.

Phase interpolation technology is a method of generating a clock having a phase between first and second phases of two input clocks. For example, a clock having a phase in a range from 0 degrees to 90 degrees may be generated based on a first clock having a phase of 0 degrees and a second clock having a phase of 90 degrees.

In particular, a half-rate clock recovery circuit that performs phase interpolation using four clocks is conventional.

The four clock recovery circuit may include a reference clock having a half frequency of input data and three clocks having a phase difference of 90 degrees, 180 degrees, and 270 degrees, respectively, with respect to the reference clock.

The half-rate clock recovery circuit may solve one or more difficulties in designing a circuit that operates at a higher speed by lowering its operating frequency.

There are at least two types of conventional half-rate clock recovery circuits, a first half-rate clock recovery circuit using at least two phase locked loops (PLLs) and a second half-rate clock recovery circuit using a single phase locked loop PLL, which generates four half-rate clocks I, Q, Ib, and Qb having 90 degree phase differences.

In order to broaden data bandwidth, the conventional half-rate clock recovery circuit may use a multi-channel configuration rather than a signal-channel configuration.

The half-rate clock recovery circuit of the multi-channel configuration may have transmitting/receiving channels in a parallel configuration, for example, parallel channels of 4, 8, 16, and so on.

The half-rate clock recovery circuit using at least two phase locked loops (PLLs) may require a larger amount of power dissipation and/or a larger chip area. In comparison, the half-rate clock recovery circuit using a single phase locked loop (PLL) generally may include a voltage-controlled oscillator (VCO) capable of generating a high frequency corresponding to an increased data transmission speed and an increased number of channels to generate four clocks having 90 degree phase differences with respect to each other to transmit the four clocks to each of the channels.

Figure 2:
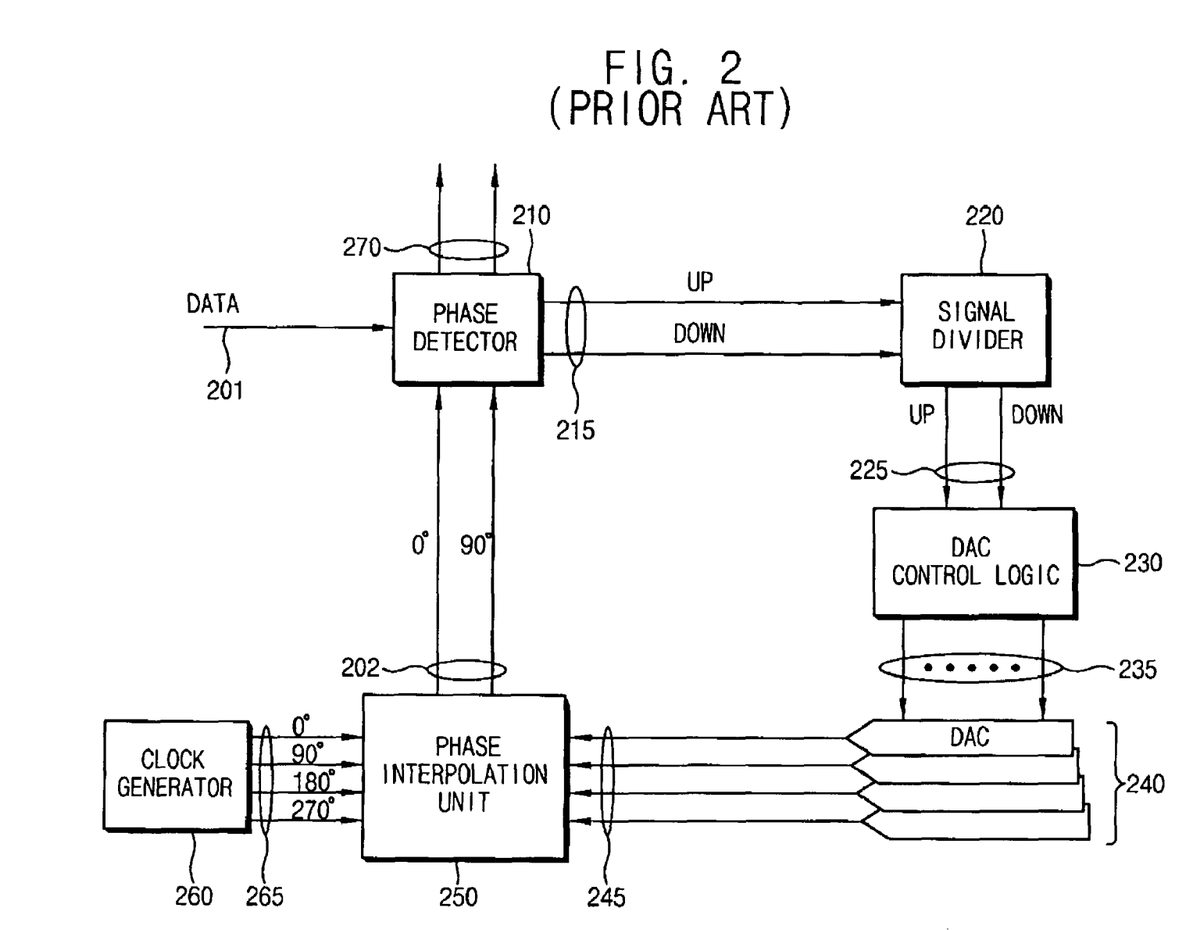
FIG. 2 is a block diagram illustrating a prior art or prior art publication date of Dec. 14, 1999 half-rate clock recovery circuit.

FIG. 2 is a block diagram illustrating a prior art or prior art publication date of Dec. 14, 1999 clock recovery circuit.

Serial input data 201 and a recovered clock 202 having a half rate to that of the serial input data 201 may be provided to a phase detector 210.

The phase detector 210 may compare a phase difference between two inputs 201 and 202, and output up/down signals 215 according to the comparison result.

The up/down signals 215 may be provided to a signal divider 220, and the signal divider 220 may output low-rate up/down signals 225, which can be available in a digital-to-analog converter (DAC) control logic 230.

The DAC control logic 230 may output digital control codes 235 based on the up/down signals 225 output from the signal divider 220, to perform a phase interpolation on the recovery clock 202.

The digital control codes 235 may be provided to a phase interpolation unit 250 via a plurality of digital-to-analog converters (DACs) 240.

The plurality of DACs 240 may include a non-linear DAC having a non-linear transfer characteristic to compensate for the non-linear characteristic of the digital control codes 235 when the digital control codes 235 output from the DAC control logic 230 are not linearly changed.

The phase interpolation unit 250 may perform a phase interpolation on four clocks 265 output from a clock generator 260 based on a weight control signal 245 output from the DAC 240, and may output the output clock 202 to track a phase of the serial input data 201.

The output clock 202 output from the phase interpolation unit 250 may be fed back to the phase detector 210. The half-rate clock recovery circuit may perform a phase interpolation on clocks having a half frequency of the serial input data 201.

For example, when a rate of the serial input data 201 is about 8.5 Gbps, the phase interpolation unit 250 performs a phase interpolation on first, second, third, and fourth clocks having a half frequency (4.25 GHz) of the serial input data 201. The second clock has a phase difference of 90 degrees with respect to a phase of the first clock, a third clock has a phase difference of 180 degrees with respect to a phase of the first clock, and a fourth clock has a phase difference of 270 degrees with respect to a phase of the first clock.

The phase detector 210 detects a phase difference between the 8.5 Gbps serial input data 201 and the first/second clocks, which are provided from the phase interpolation unit 250.

Alternatively, although not shown in FIG. 2, the phase detector 210 may multiplex the serial input data stream 201 into two data streams 270 having a half frequency of that of the serial input data stream 201 in order to recover data using the second clock having a phase difference of 90 degrees with respect to a phase of the first clock and a fourth clock having a phase difference of 270 degrees with respect to a phase of the first clock.

However, the conventional half-rate clock recovery circuit may have problems when the data-rate (or data transmission rate) increases.

There are at least two methods of generating four clocks having a half frequency (4.25 GHz) of that of the serial input data 201 and having phase differences of 90 degrees with each other to provide the four clocks to each of the channels as follows.

It is noted that a ring oscillator cannot be used to generate a frequency between 3 GHz through 4 GHz.

In a first method, when the data transmission rate is 8.5 GHz, a 8.5 GHz local voltage-controlled oscillator (VCO) may be implemented. The oscillated 8.5 GHz frequency may be divided by 2, and four clocks having a frequency of 4.25 GHz and having a phase difference of 90 degrees with each other may be generated using, for example, a flip-flop.

In the second method, when the data transmission rate is 8.5 GHz, four clocks having a frequency of 4.25 GHz and having a phase difference of 90 degrees with each other may be generated using, for example, a 4.25 GHz local voltage-controlled oscillator (VCO) and a poly-phase filter.

In both methods, four clocks having a phase difference of 90 degrees with each other are transmitted to each of the channels.

However, it may be difficult to implement a phase locked loop (PLL) that is operable at a relatively high frequency corresponding to the required data transmission speed and/or with the desired jitter characteristic.

Additionally, transferring the four clocks to each of the channels may cause a large power dissipation, mismatch between lines, and/or coupling effects, because power dissipation, mismatch between lines, and/or coupling effects may increase proportional to a frequency. Thus, transmission distance may be limited when clock buffer(s) are not used.

As the number of clock buffers increases, chip area and/or an amount of power dissipation increases, and thus a relatively larger package must be used. Also, the arrangement of a power voltage pad and a ground voltage pad may be considered in the floor plan of a chip.

SUMMARY OF THE INVENTION

In an embodiment of the present invention, a clock recovery circuit includes a clock generator adapted to generate first, second, third, and fourth clocks having a quarter frequency of a data-rate of input data, and the second, third, and fourth clocks respectively having phase differences of 90, 180, and 270 degrees with respect to a phase of the first clock, a phase interpolation unit adapted to perform a phase interpolation on the first, second, third, and fourth clocks to generate fifth, sixth, seventh, and eighth clocks having a quarter frequency of the data-rate of the input data, wherein the fifth clock tracks a phase of the input data, and the sixth, seventh, and eighth clocks respectively having phase differences of 45, 90, and 135 degrees with respect to a phase of the fifth clock, a phase detector adapted to output signals corresponding to phase differences between the input data and the fifth, sixth, seventh, and eighth clocks, and a controller adapted to receive the output signals from the phase detector and to generate control signals to control the phase interpolation unit.

In another embodiment of the present invention, a high-speed data receiver includes a clock generator adapted to generate first, second, third, and fourth clocks having a quarter frequency of a data-rate of input data, the second, third, and fourth clocks respectively having phase differences of 90, 180, and 270 degrees with respect to a phase of the first clock, and at least one clock recovery circuit coupled to the clock generator, adapted to receive the first, second, third, and fourth clocks, and adapted to reduce the data-rate of the input data using recovered clock signals to provide de-multiplexed data to multi-channels, and a controller configured to control the phase interpolation unit based on the signals output from the phase detector. The clock recovery circuit includes a phase interpolation unit having a first phase interpolator adapted to receive the first, second, third, and fourth clocks to generate a fifth clock that tracks a phase of the input data and has a quarter frequency of the data-rate of the input data, a second phase interpolator adapted to generate a sixth clock having a phase difference of 45 degrees with respect to a phase of the fifth clock, a third phase interpolator adapted to generate a seventh clock having a phase difference of 90 degrees with respect to the phase of the fifth clock, and a fourth phase interpolator adapted to generate an eighth clock having a phase difference of substantially 135 degree with respect to the phase of the fifth clock, a phase detector adapted to receive the input data and the fifth, sixth, seventh, and eighth clocks to output signals corresponding to a phase difference between the input data and the fifth, sixth, seventh, and eighth clocks.

The present invention also discloses a clock recovery method embodiment, the method includes generating first, second, third, and fourth clocks having a quarter frequency of a data-rate of input data, the second, third and fourth clocks respectively having phase differences of 90, 180, and 270 degrees with respect to a phase of the first clock, generating fifth, sixth, seventh, and eighth clocks having a quarter frequency of the data-rate of the input data, wherein the fifth clock tracks a phase of the input data, and the sixth, seventh, eighth clocks respectively having phase differences of 45, 90, and 135 degrees with respect to a phase of the fifth clock, generating control signals used to generate the fifth, sixth, seventh, and eighth clocks, and performing a phase interpolation on the first, second, third, and fourth clocks to generate the fifth, sixth, seventh, and eighth clocks.

BRIEF DESCRIPTION OF THE DRAWINGS

The above and other aspects of the present invention will become more apparent with the description of example embodiments thereof with reference to the accompanying drawings, in which.

DESCRIPTION OF EXAMPLE EMBODIMENTS

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the scope of the invention. Like numbers refer to like elements throughout the description of the figures.

It will be understood that, although the terms first, second, etc. are used herein to describe various elements, these elements should not be limited to these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes", "having" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Figure 3:
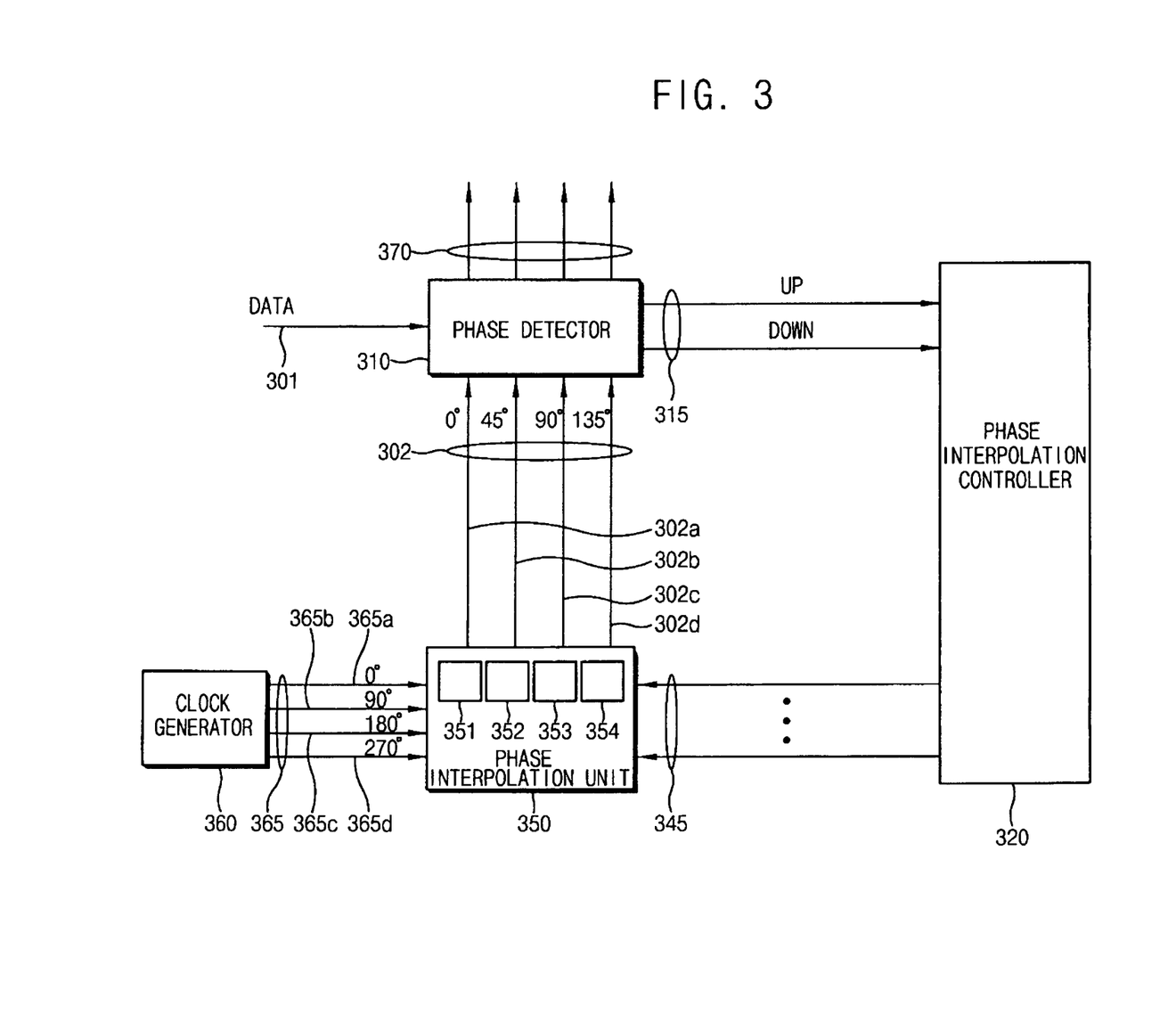
FIG. 3 is a block diagram illustrating a quarter-rate clock recovery circuit according to an example embodiment of the present invention.

FIG. 3 is a block diagram illustrating a quarter-rate clock recovery circuit according to an example embodiment of the present invention.

A clock generator 360 may generate, for example, four clocks having a quarter frequency to that of a data-rate of received data 301.

The four clocks may include a first clock 365$a$ having a phase of 0 degrees, a second clock 365$b$ having a phase of 90 degrees with respect to the phase of the first clock, a third clock 365$c$ having a phase of 180 degrees with respect to the phase of the first clock, and a fourth clock 365$d$ having a phase of 270 degrees with respect to the phase of the first clock.

Each of the four clocks may have an absolutely fixed phase regardless of a phase of the received data 301.

The clock generator 360 may employ a delay locked loop (DLL) including a ring-oscillator if the received data has a relatively low data-rate. Alternately, the clock generator 360 may employ a local voltage-controlled oscillator (VCO) and a poly-phase filter. Alternatively, the clock generator 360 may employ a local voltage-controlled oscillator (VCO) and a flip-flop if the received data has a relatively high rate.

The four clocks 365$a$ through 365$d$ may be provided to a phase interpolation unit 350. The phase interpolation unit 350 may perform a phase interpolation on the four clocks 365$a$ through 365$d$ to output a fifth clock 302$a$ having a quarter (¼) frequency of the data-rate of the received data 301 and synchronized to the received data 301, a sixth clock 302$b$ having a phase difference of 45 degrees with respect to a phase of the fifth clock 302$a$, a seventh clock 302$c$ having a phase difference of 90 degrees with respect to a phase of the fifth clock 302a, and an eighth clock 302d having a phase difference of 135 degrees with respect to a phase of the fifth clock 302a.

Phase interpolators 351, 352, 353, and 354 included in the phase interpolation unit 350 may generate four clocks having a quarter frequency to that of the data-rate of the received data 301, and a phase difference of 45 degrees between the four clocks.

After a control signal to control a phase of the fifth clock 302a is determined, other control signals to control the sixth clock 302b, the seventh clock 302c, and the eighth clock 302d may be determined based on the fact that the four clocks 302a through 302d have a phase difference of 45 degrees with respect to each other. Thus, the four phase interpolators 351, 352, 353, and 354 may be simply controlled by generating the control signals according to above described example method.

A phase interpolation controller 320 may determine a controlling method on the phase interpolators 351 through 354 included in the phase interpolation unit 350.

The fifth clock 302a through eighth clock 302d output from the phase interpolation unit 350 may be provided to a phase detector 310, and the phase detector 310 compare a phase of the received data 301 with each phase of the four clocks 302a through 302d, and reduce a data-rate of the received data 301 by performing one-to-n (for example, n is four) de-multiplex operation on the received data 301 to output n recovered data streams 370.

In alternative embodiments, n may be twenty or forty so that the input data may be de-multiplexed into twenty or forty data streams according to the de-multiplexing operation.

The phase detector 310 may determine whether each phase of the four clocks 302a through 302d leads a phase of the received data 301 or lags behind the received data 301 by comparing the phase of the received data 301 with each phase of the four clocks 302a through 302d output from the phase interpolation unit 350.

The phase detector 310 may output an activated down signal when each phase of the four clocks 302a through 302d leads the phase of the received data 301, and outputs an activated up signal when each phase of the four clocks 302a through 302d lags behind the phase of the received data 301.

In alternative embodiments, the definition of the terms "up signal" and "down signal" is interchangeable. Additionally, the phase detection function and the de-multiplex function may be implemented onto a single circuit block as illustrated in FIG. 3. Alternatively, each of the phase detection function and the de-multiplex function may be separately implemented on separate circuit blocks.

The phase interpolation controller 320 may be implemented in various configurations to form a feedback circuit with the phase detector 310 and the phase interpolation unit 350.

Figure 4:
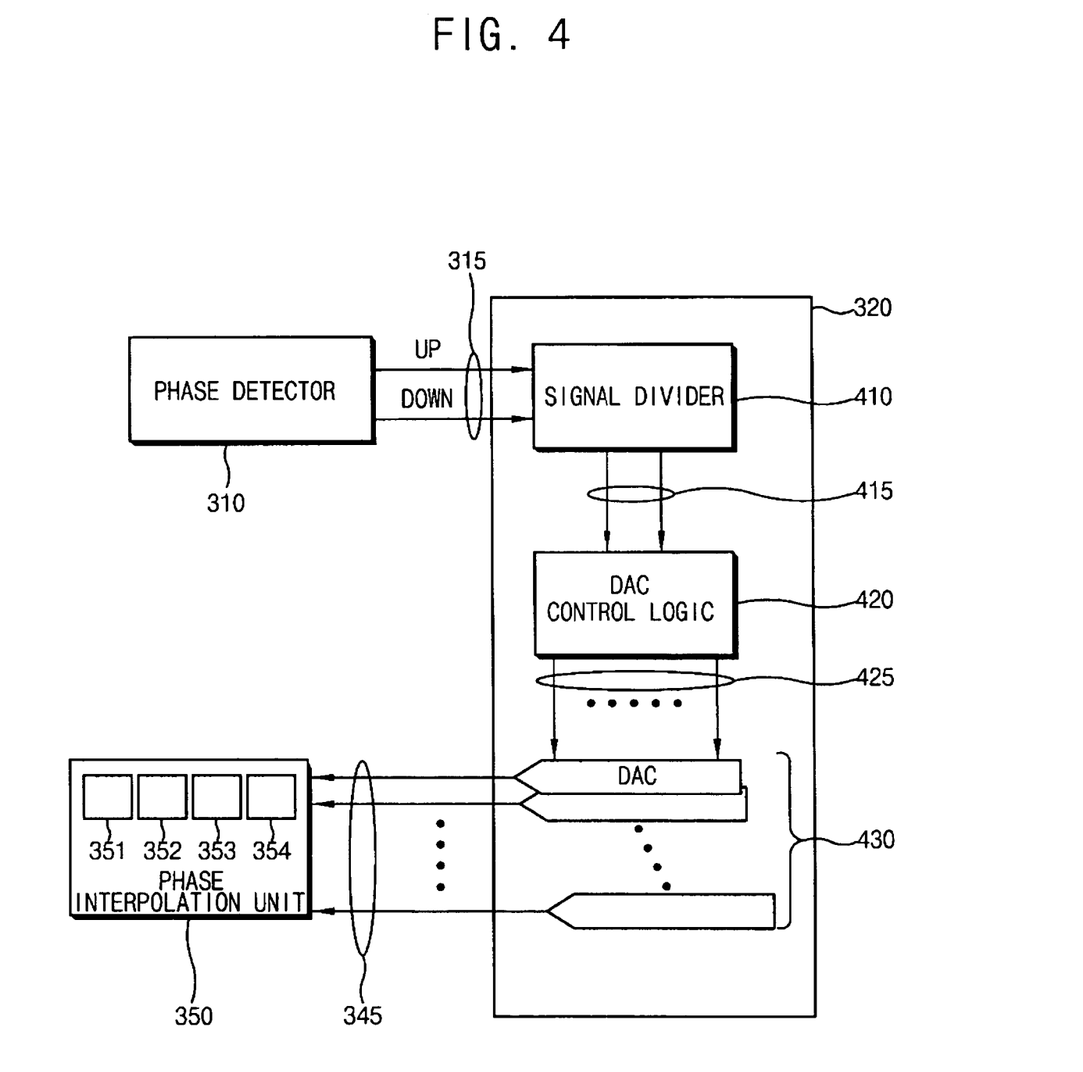
FIG. 4 is a block diagram illustrating a phase interpolation controller according to an example embodiment of the present invention.

FIG. 4 is a block diagram illustrating a phase interpolation controller according to an example embodiment of the present invention.

In alternative embodiments, the phase interpolation controller 320 may be implemented using an analog control method to improve operation speed as compared to the digital control method of FIG. 4. For example, the phase interpolation controller 320 may be implemented with a charge pump.

Referring to FIG. 4, the phase interpolation controller 320 may include a signal divider 410, a digital-to-analog converter (DAC) control logic 420, and/or a plurality of digital-to-analog converters (DACs) 430.

An up signal and a down signal output from the phase detector 310 may be to the signal divider 410.

The signal divider 410 may lower the frequency of the up/down signals provided from the phase detector 310.

For example, if the up/down signals having a frequency of about 2.125 GHz are provided to the signal divider 410, the signal divider 410 may convert the up/down signals into signals having a lower frequency of about 425 MHz.

In order to convert a rate of the up/down signal output from the phase detector 310 into a rate available in the DAC control logic 420 that is implemented by complementary metal-oxide-semiconductor (CMOS) logic, the process of lowering the frequency of the up/down signal may be performed.

The DAC control logic 420 and the plurality of DACs 430 may control the phase interpolation unit 350 using the up/down signals output from the signal divider 410. The DAC control logic 420 may output control codes 425 to the plurality of DACs 430. The control codes 425 may be converted into analog control signals via the plurality of DACs 430 and may be used to control the four phase interpolators 351 through 354 included in the phase interpolation unit 350.

In an example embodiment of the present invention, the plurality of DACs may include eight DACs (DAC1 through DAC8). That is, the DAC1 through DAC4 output control signals to control the phase interpolators 351, 353 that generate a fifth clock 302a and a seventh clock 302c, respectively. The DAC5 through DAC8 may output control signals to control the phase interpolators 352, 354 that generate a sixth clock 302b and an eighth clock 302d, respectively.

In order to reduce the number of the phase interpolators, the DAC control logic 420 may produce control codes to generate the sixth clock through the eighth clock by calculating an offset from the control code to generate the fifth clock. The control codes to generate the sixth clock through the eighth clock may be obtained using the control code to generate the fifth clock.

The DAC control logic 420 may include a k-bit bi-directional shift register. The k may be variable according to a degree of resolving power.

For example, a 32-bit shift register can control a phase of a clock by decomposing a quadrant corresponding to a phase of 90 degrees into 32 sections (steps). Accordingly, the 32-bit shift register may control a phase of a clock by decomposing a phase of 360 degrees into 128 steps.

The shift register included in the DAC control logic 420 may perform a shift operation according to the up/down signals provided from the signal divider 410.

When the DAC control logic 420 includes a 32-bit shift register, the value of the 32-bit shift register may be set to "00000000h" at an initial stage.

When the 32 bits shift register receives the activated "up" signal from the signal divider 410, the shift register may shift right and the most significant bit (MSB) is set to "1".

When all the bits of the shift register are set to "111 . . . 111," accordingly the 32-bit shift register may receive a plurality of activated "up" signals from the signal divider 410, the shift register may reverse the shift direction, and start left-shifting with a least significant bit (LSB) set to "0".

When the 32-bit shift register receives the activated "down" signal from the signal divider 410, the shift register may shift left and sets the least significant bit (LSB) to "0".

When all bits of the shift register are set to "000 . . . 000," accordingly the 32-bit shift register receives a plurality of activated "down" signals from the signal divider 410, the shift register may reverse the shift direction, and start right-shifting with the most significant bit (MSB) set to "1".

The 32-bit control code, which is used to generate the fifth clock based on the first through fourth clocks 365, may be generated using the 32-bit shift register bi-directionally performing the shift operation like a ping-pong action according to the up/down signals.

Figure 5A:
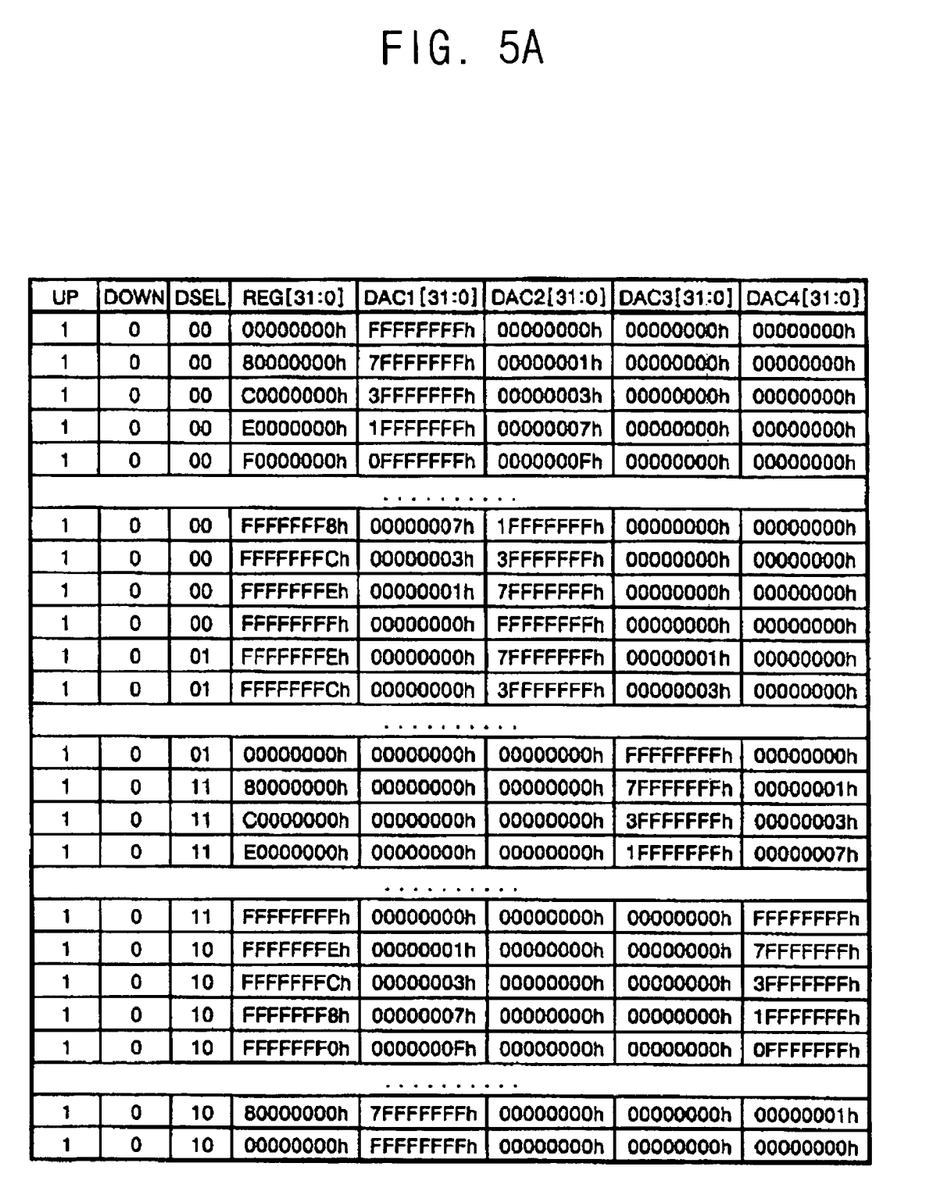
FIGS. 5A and 5B are tables illustrating operations of a digital-to-analog converter (DAC) control logic to control a phase interpolation unit of FIG. 4 according to an example embodiment of the present invention.

FIG. 5A is a table illustrating operations of the DAC control logic to control the phase interpolation unit of FIG. 4 according to an example embodiment of the present invention.

In the table illustrated in FIG. 5A, a first column denotes an "up" signal and a second column denotes a "down" signal.

A third column DSEL denotes a value of a register used to select two clocks having a phase difference of 90 degrees with respect to each other among the first clock through the fourth clock in the phase interpolator 351 that generates the fifth clock. The DSE1 register may be composed of 2 bits and may be included in the DAC control logic 420.

The DAC control logic 420 may determine control codes corresponding to the first DAC1 through the fourth DAC4 using the DSEL register and the 32-bit shift register.

An upper bit of the DSEL register may be used to select one of the second clock 365b having a phase of 90 degrees or the fourth clock 365d having a phase of 270 degrees.

For example, when the upper bit of the DSEL register is "0", the second clock 365b is selected, and when the upper bit of the DSEL register is "1", the fourth clock 365d is selected.

A lower bit of the DSEL register may be used to select either the first clock 365a having a phase of 0 degrees or the third clock 365c having a phase of 180 degrees.

For example, when the lower bit of the DSEL register is "0", the first clock 365a is selected, and when the lower bit of the DSEL register is "1", the third clock 365c is selected.

Whenever the shift direction of the shift register is changed in response to the up/down signals, the value of the DSEL register may be altered so as to select two clocks to generate the fifth clock among the first through fourth clocks 365. That is, the value of the DSEL register may be altered so as to indicate a new quadrant whenever a phase of the fifth clock is changed from one quadrant to another quadrant.

A fourth column of FIG. 5A denotes a state of the shift register, and the 5$^{th}$ through the 8$^{th}$ columns denote control codes corresponding to four DACs, i.e., DAC1, DAC2, DAC3 and DAC4, to respectively output a weight control signal for the first, second, third, and fourth clocks 365.

As illustrated in the table of FIG. 5A, the control codes DAC1 [31:0], DAC2 [31:0], DAC3 [31:0], and DAC4 [31:0] applied to the four DACs may be set according to the value of the 32-bit shift register and the value of the DSEL register.

The control code to generate the fifth clock 302a may be used to generate the seventh clock 302c having a phase difference of 90 degrees with respect to a phase of the fifth clock 302a. In this case, the phase interpolator 353 to generate the seventh clock 302c may be designed to output a clock having a phase difference of 90 degrees with respect to a clock output from the phase interpolator 351 to generate the fifth clock 302a.

In alternative embodiments, the four phase interpolators 351 through 354 having identical configurations may be implemented. Also, 16 DACs may be used instead of 8 DACs.

Additionally, the sixth clock 302b having a phase difference of 45 degrees with respect to a phase of the fifth clock 302a may be obtained by applying an offset corresponding to 45 degrees to the control code to generate the fifth clock 302a, and the eighth clock 302d having a phase difference of 45 degrees with respect to a phase of the seventh clock 302c may be obtained by applying an offset corresponding to 45 degrees to the control code to generate the seventh clock 302c.

Figure 5B:
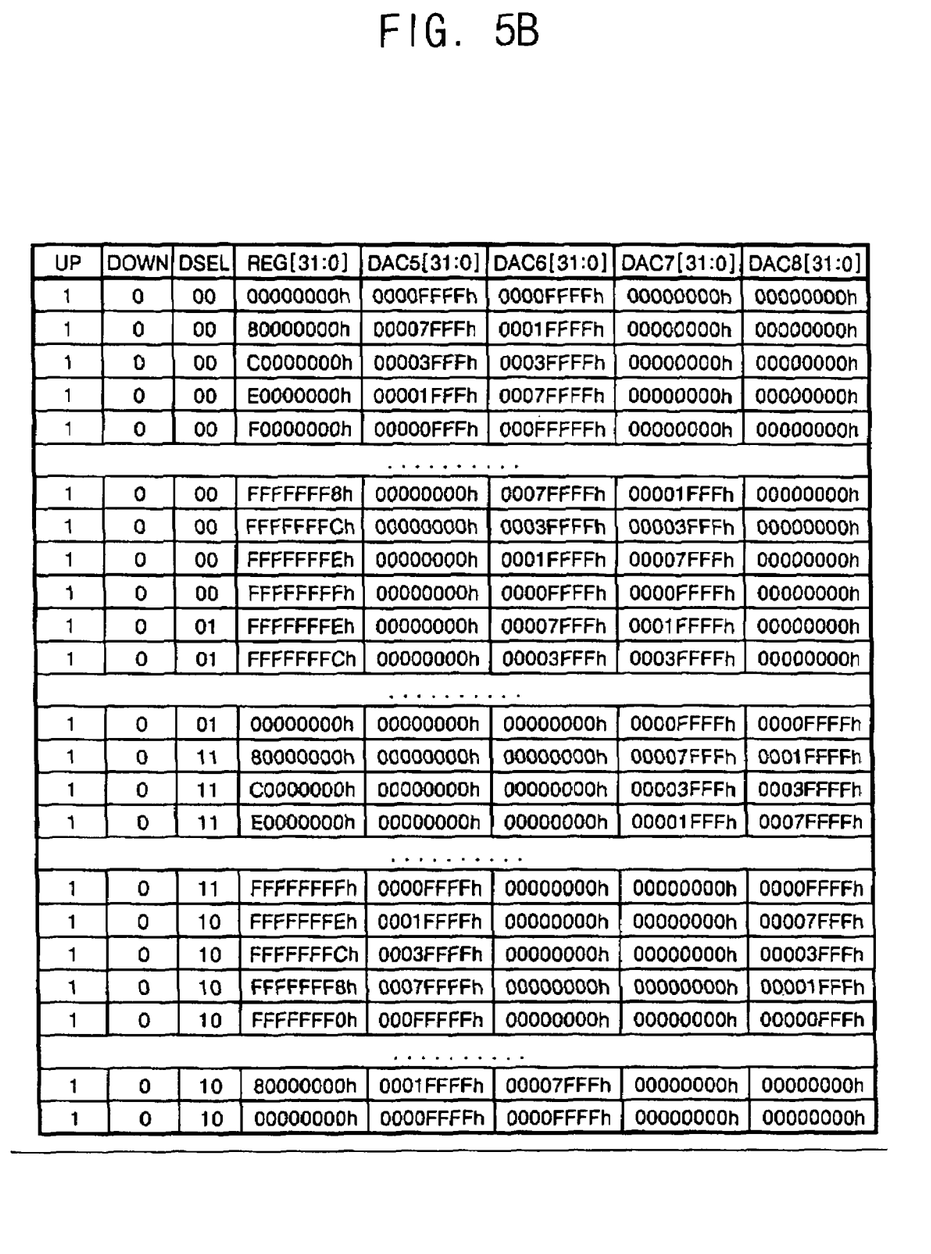

FIG. 5B is a table illustrating operations of a DAC control logic to control a phase interpolation unit of FIG. 4 according to an example embodiment of the present invention.

Referring to FIG. 5B, an offset may be used so as to obtain the control codes to generate the sixth and eighth clocks 302b and 302d, which have a phase difference of 45 degrees with respect to the phase of the fifth clock and the phase of seventh clock 302c, respectively, from the control codes to generate the fifth clock 302a and the seventh clock 302d.

For example, when the fifth clock 302a having a phase difference of 0 degrees with respect to the phase of the first clock 365a is generated, the sixth clock 302b may have a phase difference of 45 degrees with respect to the phase of the first clock 365a. Thus, as shown in FIG. 5B, the control codes to generate the sixth clock 302b and the eighth clock 302d may be shifted right 16 positions (or steps) with zero bits compared with the control codes to generate the fifth clock 302a and the seventh clock 302c shown in FIG. 5A. A quadrant corresponds to a phase of 90 degrees and may be divided into 32 sections (or steps).

That is, when the fifth clock 302a has a phase difference of 0 degrees with respect to the phase of the first clock 365a, the control code of the DAC1 may be "FFFFFFFFh", and the control code of the DAC2 may be "00000000h". The control code of the DAC3 and DAC4 may be "00000000h".

Because the sixth clock 302b has a phase difference of 45 degrees with respect to the phase of the fifth clock 302a, the control code of the DACS to generate the sixth clock 302b may be "0000FFFFh" and the control code of the DAC6 may be "0000FFFFh" so as to have a phase difference of 45 degrees with respect to the phase of the first clock. The control codes of the DAC7 and DAC8 are "00000000h".

The control codes generated from the DAC control logic 420 may pass through the plurality of DACs 430, may be converted to analog control signals, and may be provided to the phase interpolation unit 350.

As described above, the plurality of DACs 420 may include a non-linear DAC having a non-linear transfer characteristic.

Figure 6:
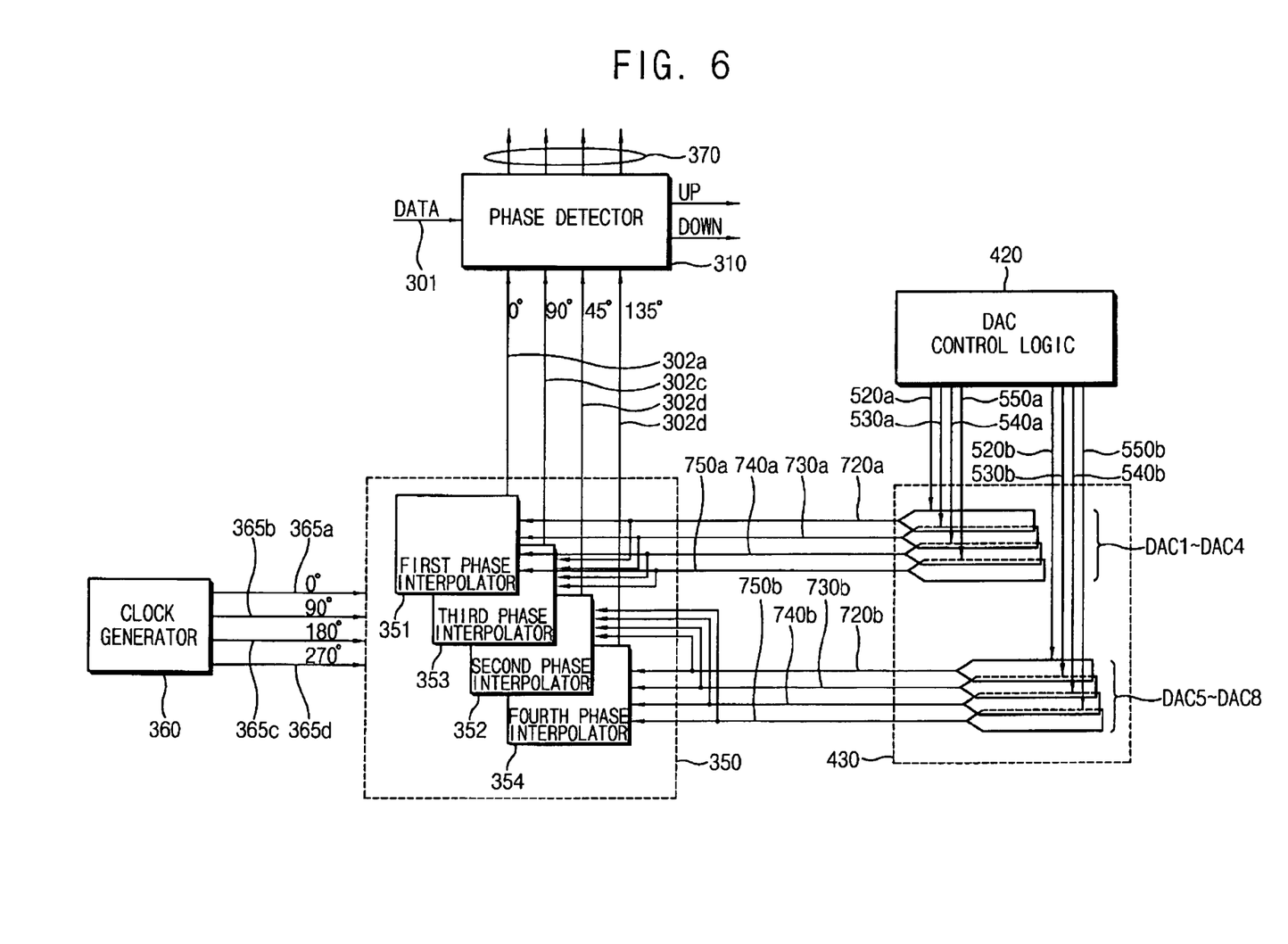
FIG. 6 is a block diagram illustrating a connection relationship between a phase interpolation unit and a plurality of digital-analog converters DACs according to an example embodiment of the present invention.

FIG. 6 is a block diagram illustrating a connection relationship between a phase interpolation unit and the plurality of digital-analog converters DACs according to an example embodiment of the present invention.

The phase interpolation unit 350 may include four phase interpolators 351, 352, 353, and 354. The plurality of DACs may include eight DACs (DAC1 through DAC4 and DAC5 through DAC8), and receive control codes 520a, 530a, 540a, 550a, 520b, 530b, 540b, and 550b from the DAC control logic 420 to output eight analog control signals 720a, 730a, 740a, 750a, 720b, 730b, 740b, and 750b into the phase interpolation unit 350.

The first phase interpolator 351 of the phase interpolation unit 350 may receive the four clocks 365a through 365d provided from the clock generator 360 and the control signals 720a, 730a, 740a, and 750a output from the DAC1 through DAC4.

The second phase interpolator 352 of the phase interpolation unit 350 may receive the four clocks 365a through 365d provided from the clock generator 360 and the control signals 720b, 730b, 740b, and 750b output from the DAC5 through DAC8.

The third phase interpolator 353 of the phase interpolation unit 350 may receive the four clocks 365a through 365d provided from the clock generator 360 and the control signals 720a, 730a, 740a, and 750a output from the DAC1 through DAC4.

The fourth phase interpolator 354 of the phase interpolation unit 350 may receive the four clocks 365a through 365d provided from the clock generator 360 and the control signals 720b, 730b, 740b, and 750b output from the DAC5 through DAC8.

Figure 7:
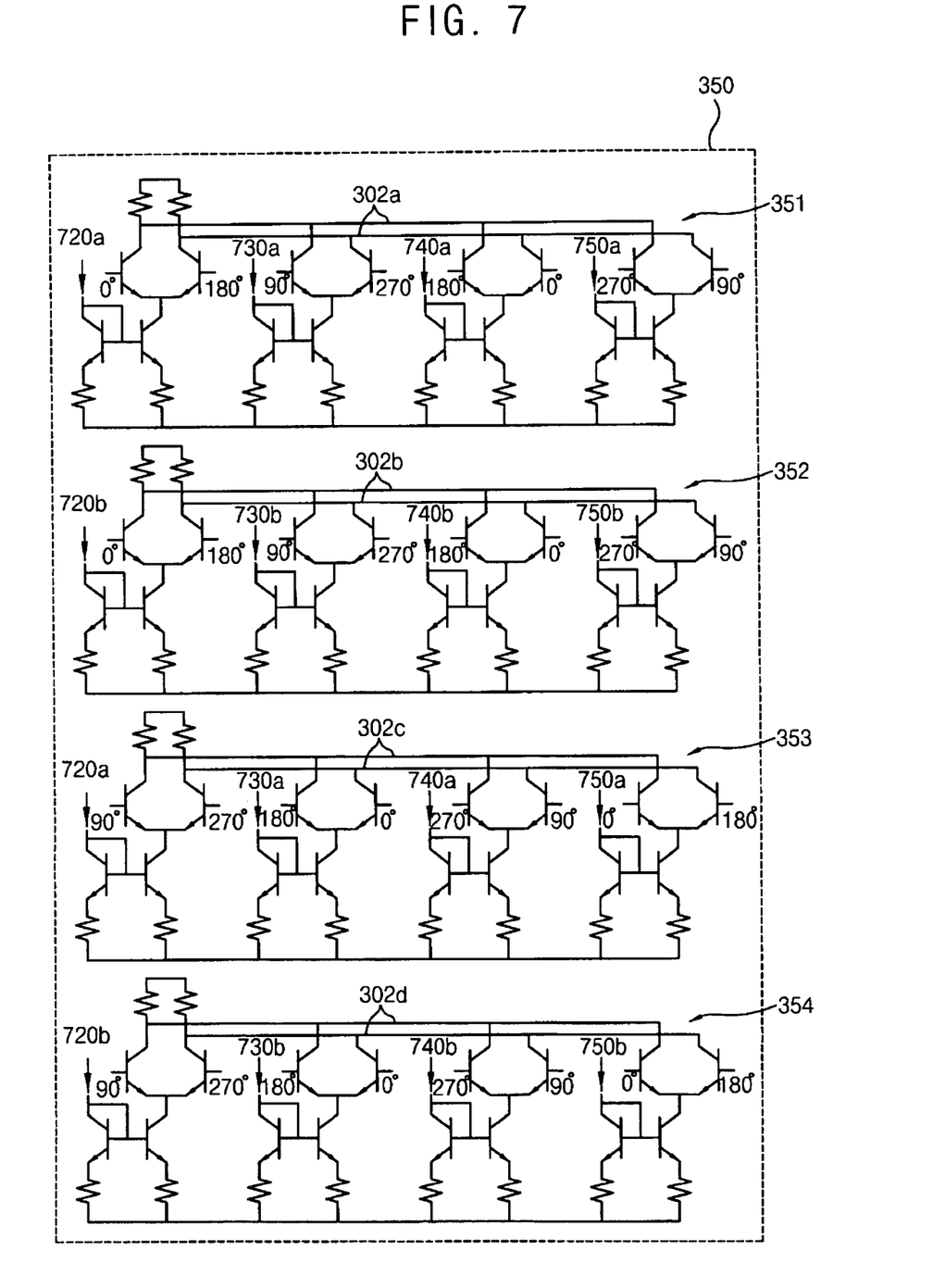
FIG. 7 is a circuit diagram illustrating phase interpolators having a phase interpolation unit according to an example embodiment of the present invention.

FIG. 7 is a circuit diagram illustrating the phase interpolators included in the phase interpolation unit according to an example embodiment of the present invention.

The phase interpolation unit 350 may include four phase interpolators 351, 352, 353, and 354.

The control codes output from the DAC control logic 420 may pass through the plurality of DACs 430, may be converted to the analog control signals, and the analog control signals may be provided to the phase interpolation unit 350.

The first phase interpolator 351 may generate the fifth clock 302a tracking a phase of the input data 301. The second phase interpolator 352 may generate the sixth clock 302b having a phase difference of 45 degrees with respect to the phase of the fifth clock 302a, and the third phase interpolator 353 may generate the seventh clock 302c having the phase difference of 90 degrees with respect to the phase of the fifth clock 302a. The fourth phase interpolator 354 may generate the eighth clock 302d having the phase difference of 135 degrees with respect to the phase of the fifth clock 302a.

As described above, because the control signals to generate the fifth clock 302a and the seventh clock 302d are identical to each other, the four DACs (DAC1 through DAC4) that output the control signals to generate the fifth clock 302a may be reused to generate the seventh clock 302c.

As shown in FIG. 7, the phase interpolator 351 to generate the fifth clock 302a and the phase interpolator 353 to generate the seventh clock 302c may have different configuration from each other so as to generate clocks having a phase difference of 90 degrees with respect to each other.

Similarly, because the control signals to generate the sixth clock 302b and the eighth clock 302d are identical to each other, the four DACs (DAC5 through DAC8) that output the control signals to generate the sixth clock 302b may be reused to generate the eighth clock 302d.

The phase interpolator 352 to generate the sixth clock 302b and the phase interpolar 354 to generate the eighth clock 302d may have different configuration from each other to generate clocks having a phase difference of 90 degrees with respect to each other.

The fifth clock 302a through the eighth clock 302d output from the phase interpolation unit 350 may be provided to the phase detector 310 to form a feedback circuit.

Figure 8:
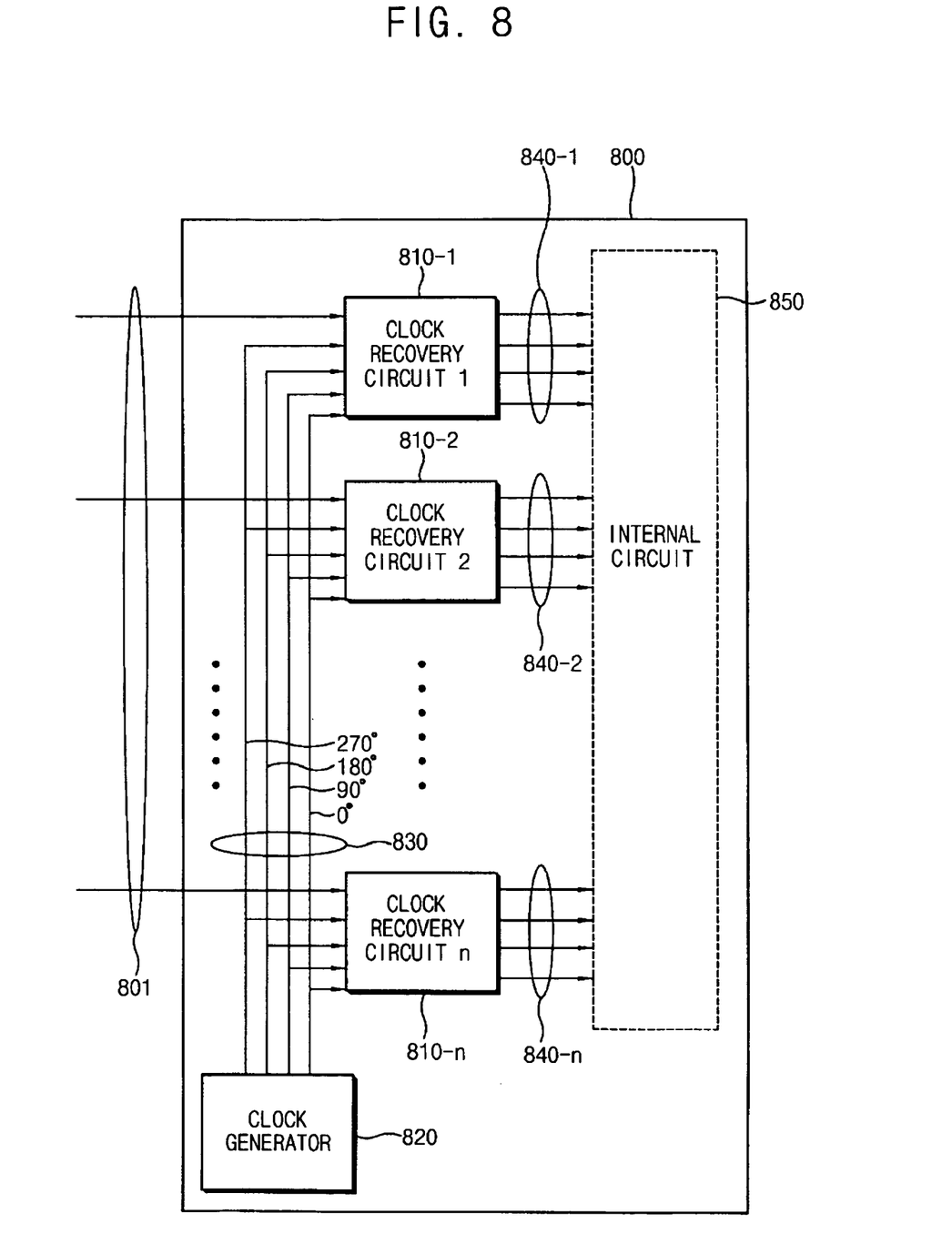
FIG. 8 is a block diagram illustrating a high-speed data receiver using a clock recovery circuit according to an example embodiment of the present invention.

FIG. 8 is a block diagram illustrating a high-speed data receiver using a clock recovery circuit according to an example embodiment of the present invention.

The high-speed data receiver 800 using the clock recovery circuit according to example embodiments of the present invention may include a plurality of clock recovery circuits 810-1 through 810-n, which receive high-speed serial data streams 801 corresponding to the number of the clock recovery circuits.

A clock generator 820 may output four clocks 830 having a phase difference of 90 degrees with respect to each other and having a quarter frequency of the data-rate of the received high-speed serial data.

The plurality of clock recovery circuits 810-1 through 810-n may be commonly coupled to the clock generator 820 and may receive the four clocks 830 output from the clock generator 820.

The plurality of clock recovery circuits 810-1 through 810-n may de-multiplex the high-speed serial data streams 801 into four data streams 840-1 through 840-n using four recovered clocks having a phase difference of 45 degrees with respect to each other.

The four recovered clocks may be generated by the clock recovery circuits 810-1 through 810-n using the four clocks 830 output from the clock generator 820.

The plurality of the clock recovery circuits 810-1 through 810-n may output the multiplexed data streams 840-1 through 840-n to an internal circuit 850.

The internal circuit 850 may de-multiplex the de-multiplexed data streams 840-1 through 840-n into data streams having a lower frequency than that of the data streams 840-1 through 840-n.

According to the quarter-rate clock recovery circuit of the example embodiments of the present invention, the quarter-rate clock recovery circuit may employ four phase interpolators. The four phase interpolators generate four clocks, which track the received data, have a ¼ rate of the data-rate of the received data, and have a phase difference of 45 degrees with respect to each other from the four clocks that have a ¼ rate of the data-rate of the received data and have a phase difference of 90 degrees with respect to each other.

Because four clocks having a phase difference of 45 degrees with respect to each other are generated using minimum number of phase interpolators, the burden of designing a clock source such as a phase locked loop (PLL) may be reduced. For example, an operation frequency of the clock generator, for example, a VCO may be reduced by half compared with the half-rate clock recovery circuit and/or a clock source having a desired jitter characteristic can be easily designed.

In addition, power dissipation, mismatch between lines, and/or a coupling effect may be reduced by lowering an operating frequency of the clock generator, thereby a high quality clock may be generated.

Further, the quarter-rate clock recovery circuit employing a multi-channel configuration, buffers that are inserted between each of the channel and which provide clocks to each of the channels may be easily implemented and/or the power dissipation of the buffers may be reduced because the number of the buffers may be reduced. Further, total chip area may be reduced.

While the example embodiments of the present invention and their advantages have been described in detail, it should be understood that various changes, substitutions and alterations may be made herein without departing from the scope of the invention.

What is claimed is:

1. A clock recovery circuit comprising:
a clock generator adapted to generate first, second, third, and fourth clocks having a quarter frequency of a data-rate of input data, and the second, third, and fourth clocks with respect to a phase of the first clock having phase differences of 90, 180, and 270 degrees, respectively;
  a phase interpolation unit adapted to perform a phase interpolation on the first, second, third, and fourth clocks to generate fifth, sixth, seventh, and eighth clocks, respectively, each having a quarter frequency of the data-rate of the input data, wherein the fifth clock tracks a phase of the input data, and the sixth, seventh, and eighth clocks having phase differences of 45, 90, and 135 degrees with respect to a phase of the fifth clock, respectively;
  a phase detector adapted to output signals corresponding to phase differences between the input data and the fifth, sixth, seventh, and eighth clocks; and
  a controller adapted to receive the output signals from the phase detector and to generate control signals to control the phase interpolation unit, wherein the phase interpolation unit includes
a first phase interpolator adapted to generate the fifth clock based on the control signals and the first, second, third, and fourth clocks,
a second phase interpolator adapted to generate the sixth clock,
a third phase interpolator adapted to generate the seventh clock, and
a fourth phase interpolator adapted to generate the eighth clock.

2. The clock recovery circuit of claim 1, wherein the clock generator includes a ring voltage-controlled oscillator.

3. The clock recovery circuit of claim 1, wherein the clock generator includes a local voltage-controlled oscillator (VCO) and at least one poly-phase filter.

4. The clock recovery circuit of claim 1, wherein the phase detector is adapted to receive the input data and the fifth, sixth, seventh, and eighth clocks, and output an up signal and a down signal based on the phase differences between the input data and the fifth, sixth, seventh, and eighth clocks.

5. The clock recovery circuit of claim 4, wherein the phase detector outputs an activated down signal and an inactivated up signal when a phase of the input data lags behind phases of the fifth, sixth, seventh, and eighth clocks, and outputs an activated up signal and an inactivated down signal when a phase of the input data leads phases of the fifth, sixth, seventh, and eighth clocks.

6. The clock recovery circuit of claim 1, wherein the phase detector reduces the data-rate of the input data into four data streams having a quarter frequency of the data-rate of the input data using the input data and the fifth, sixth, seventh, and eighth clocks.

7. The clock recovery circuit of claim 1, wherein the controller comprises:
digital-to-analog converter (DAC) control logic adapted to generate a plurality of control codes in response to an up signal and a down signal; and
at least one digital-to-analog converter (DAC) adapted to generate the control signals based on the control codes.

8. The clock recovery circuit of claim 7, wherein the controller further comprises a signal divider adapted to divide a first frequency of the up signal and the down signal into a second frequency lower than the first frequency, and adapted to provide outputs of the signal divider to the DAC control logic.

9. The clock recovery circuit of claim 8, wherein the DAC control logic is adapted to operate in response to the second frequency.

10. The clock recovery circuit of claim 7, wherein the control signals for controlling the phase interpolation unit includes:
a first control signal set adapted to control the first phase interpolator;
a second control signal set adapted to control the second phase interpolator;
a third control signal set adapted to control the third phase interpolator; and
a fourth control signal set adapted to control the fourth phase interpolator.

11. The clock recovery circuit of claim 10, wherein the second control signal set is generated from the first control signal set to general the sixth clock; wherein the third control signal set is generated from the first control signal set to generate the seventh clock; and wherein the fourth control signal set is generated from the first control signal set to generate the eighth clock.

12. The clock recovery circuit of claim 7, wherein the plurality of control codes includes:
a first control signal set adapted to control the first phase interpolator and the third phase interpolator; and
a second control signal set adapted to control the second phase interpolator and the fourth phase interpolator.

13. The clock recovery circuit of claim 12, wherein the second control signal set is generated from the first control signal set to generate the sixth clock and the eighth clock.

14. A high-speed data receiver comprising:
a clock generator adapted to generate first, second, third, and fourth clocks having a quarter frequency of a data-rate of input data, the second, third, and fourth clocks having phase differences of 90, 180, and 270 degrees with respect to a phase of the first clock, respectively; and
at least one clock recovery circuit coupled to the clock generator, adapted to receive the first, second, third, and fourth clocks, and adapted to reduce the data-rate of the input data using recovered clock signals to provide de-multiplexed data to multi-channels,
wherein the at least one clock recovery circuit includes:
a phase interpolation unit having:
a first phase interpolator adapted to receive the first, second, third, and fourth clocks to generate a fifth clock that tracks a phase of the input data and has a quarter frequency of the data-rate of the input data;
a second phase interpolator adapted to generate a sixth clock having a phase difference of 45 degrees with respect to a phase of the fifth clock;
a third phase interpolator adapted to generate a seventh clock having a phase difference of 90 degrees with respect to the phase of the fifth clock; and
a fourth phase interpolator adapted to generate an eighth clock having a phase difference of substantially 135 degree with respect to the phase of the fifth clock;
a phase detector adapted to receive the input data and the fifth, sixth, seventh, and eighth clocks to output signals corresponding to a phase difference between the input data and the fifth, sixth, seventh, and eighth clocks; and
a controller configured to control the phase interpolation unit based on the signals output from the phase detector.

15. A clock recovery method comprising:
generating first, second, third, and fourth clocks having a quarter frequency of a data-rate of input data, the second, third and fourth clocks having phase differences of 90, 180, and 270 degrees with respect to a phase of the first clock, respectively;
generating fifth, sixth, seventh, and eighth clocks having a quarter frequency of the data-rate of the input data, wherein the fifth clock tracks a phase of the input data, and the sixth, seventh, eighth clocks having phase differences of 45, 90, and 135 degrees with respect to a phase of the fifth clock, respectively;
generating control signals used to generate the fifth, sixth, seventh, and eighth clocks; and
performing a phase interpolation on the first, second, third, and fourth clocks to generate the fifth, sixth, seventh, and eighth clocks, wherein the phase interpolation is performed by a phase interpolation unit that includes a first phase interpolator adapted to generate the fifth clock based on the control signals and the first, second third and fourth clocks a second phase interpolator adapted to generate the sixth clock, a third phase interpolator adapted to generate the seventh clock, and a fourth phase interpolator adapted to generate the eighth clock.

16. The method of claim 15, wherein the signals include an up signal and a down signal.

17. The method of claim 16, wherein the down signal is activated and the up signal is inactivated when a phase of the input data lags behind phases of the fifth, sixth, seventh, and eighth clocks, and wherein the up signal is activated and the down signal is inactivated when the phase of the input data leads the phases of the fifth, sixth, seventh, and eighth clocks.

18. The method of claim 15, wherein the control signals includes:
- a first control signal used to control a first phase interpolation, which generates the fifth clock;
- a second control signal used to control a second phase interpolation, which generates the sixth clock;
- a third control signal used to control a third phase interpolation, which generates the seventh clock; and
- a fourth control signal used to control a fourth phase interpolation, which generates the eighth clock.

19. The method of claim 18, wherein the second control signal is generated from the first control signal so as to generate the sixth clock having a phase delay of 45 degrees with respect to a phase of the fifth clock phase-interpolated by the first control signal; the third control signal is generated from the first control signal so as to generate the seventh clock having a phase delay of 90 degrees with respect to the phase of the fifth clock phase-interpolated by the first control signal; and the fourth control signal is generated from the first control signal so as to generate the eighth clock having a phase delay of 135 degrees with respect to the phase of the fifth clock phase-interpolated by the first control signal.

* * * * *